(12) United States Patent
Wilk et al.

(10) Patent No.: US 7,030,038 B1
(45) Date of Patent: Apr. 18, 2006

(54) LOW TEMPERATURE METHOD FOR FORMING A THIN, UNIFORM OXIDE

(75) Inventors: Glen D. Wilk, Dallas, TX (US); Robert M. Wallace, Richardson, TX (US); Berinder P. S. Brar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1357 days.

(21) Appl. No.: 09/176,422

(22) Filed: Oct. 21, 1998

Related U.S. Application Data

(63) Continuation-in-part of application No. 08/904,009, filed on Jul. 31, 1997, now Pat. No. 6,020,247.

(60) Provisional application No. 60/063,010, filed on Oct. 23, 1997.

(51) Int. Cl.
H01L 21/31 (2006.01)
H01L 21/469 (2006.01)

(52) U.S. Cl. .............. 438/769; 438/770; 438/771

(58) Field of Classification Search ........... 438/771, 438/772, 770, 769
See application file for complete search history.

(56) References Cited

U.S. PATENT DOCUMENTS

| | | | |
|---|---|---|---|
| 4,412,310 A * | 10/1983 | Korsh et al. ......... 365/185.18 |
| 4,604,304 A * | 8/1986 | Faraone et al. ............ 427/255 |
| 4,851,370 A * | 7/1989 | Doklan et al. ............ 437/225 |
| 5,028,560 A | 7/1991 | Tsukamoto et al. .......... 437/81 |
| 5,194,397 A * | 3/1993 | Cook et al. .................. 437/31 |
| 5,275,687 A * | 1/1994 | Choquette et al. ......... 156/612 |
| 5,294,571 A * | 3/1994 | Fujishiro et al. ........... 437/239 |
| 5,330,935 A | 7/1994 | Dobuzinsky et al. ...... 437/239 |
| 5,412,246 A | 5/1995 | Dobuzinsky et al. ...... 257/632 |
| 5,443,863 A | 8/1995 | Neely et al. ................ 427/579 |
| 5,455,204 A | 10/1995 | Dobuzinsky et al. ...... 437/238 |
| 5,589,422 A | 12/1996 | Bhat .......................... 437/228 |
| 6,159,559 A * | 12/2000 | Reber et al. ................ 427/579 |
| 6,531,193 B1 * | 3/2003 | Fonash et al. .............. 427/579 |

OTHER PUBLICATIONS

Nayar, V.; Patel, P.; Boyd, I. W.; "Atmospheric pressure, low temperature (<500 C) UV/ozone oxidation of silicon," Electron. Lett., vol. 26, pp. 205-206, 1990.*
Wolf, S.; Tauber, R. N.; Silicon Processing For the VLSI Era: vol. 3; Lattice Press; Sunset Beach, Ca.; 1995; pp. 422-423.*

(Continued)

*Primary Examiner*—W. David Coleman
*Assistant Examiner*—Khiem Nguyen
(74) *Attorney, Agent, or Firm*—David Denker; W. James Brady, III; Frederick J. Telecky, Jr.

(57) ABSTRACT

This invention pertains generally to forming thin oxides at low temperatures, and more particularly to forming uniformly thick, thin oxides. We disclose a low temperature method for forming a thin, uniform oxide 16 on a silicon surface 12. This method includes providing a partially completed integrated circuit on a semiconductor substrate 10 with a clean, hydrogen terminated or atomically flat, silicon surface 12; and stabilizing the substrate at a first temperature. The method further includes exposing the silicon surface to an atmosphere 14 including ozone, while maintaining the substrate 10 at the first temperature. In this method, the exposing step creates a uniformly thick, oxide film 16. This method is suitable for room temperature processing.

25 Claims, 2 Drawing Sheets

OTHER PUBLICATIONS

Nayar, et al., "Chemically Treated Stepped Silicon {100} Surfaces," Proceedings of the International Symposium on the Ultra-Clean Processing of Silicon Surfaces, Sep. 19, 1994, pp. 371-374 (Vishal Nayar, Allan J. Pidduck, Mohammed Idrees and Beverley E.J. Dew).

V. Nayar, et al., "Atmospheric Pressure, Low Temperature (<500° C) UV/Ozone Oxidation of Silicon," Electronic Letters, Feb. 1, 1990, vol. 26, No. 3, pp. 205-206 (V. Nayar, P. Patel, Ian W. Boyd).

Morita, et al., "Effects of Si Wafer Surface Micro-Roughness on Electrical Properties of Very-Thin Gate Oxide Films," Proceedings of the International Symposium on Ultra Large Scale Integration Science and Technology, Pennington, NJ, May 5, 1991, pp. 400-408 (M. Morita, A. Teramoto, K. Makihara, and T. Ohmi).

Wilk, et al., "In Situ Si Flux Cleaning Technique for Producing Atomically Flat Si(100) Surfaces at Low Temperature," Appl. Phys. Lett. 70, Apr. 28, 1997, pp. 2288-2290 (G.D. Wilk, Yi Wei, Hal Edwards, and R.M. Wallace).

Chin, et al., "Thin Oxides With In-Situ Native Oxide Removal," IEEE Electron Device Letters, IEEE Inc. New York, vol. 18, No. 9, Sep. 1, 1997, pp. 417-419 (Albert Chin, Senior Member IEEE, W. J. Chen, T. Chang, R.H. Kao, B.C. Lin, Tsai and J.C.-M Huang).

Froeschle, et al., "Cleaning Process Optimization in a Gate Oxide Cluster Tool Using an In-Line XPS Module," Mat. Res. Soc. Symp., Proc. vol. 477, Apr. 1, 1997, pp. 371-377 (Barbara Froeschle, Frederique Glowacki, Anton J. Bauer, Igor Kasko, Richard Oechsner and Claus Schneider).

Nakanishi, et al., "Ultrathin Oxides by UV/Ozone Pretreatment Cleaning and Ozone Oxidation," Proceedings of the International Symposium of the Physics and Chemistry of $SOi_2$ and the $Si-SiO_2$ Interface, vol. 96, No. 1, May 5, 1996, pp. 316-328 (Toshiro Nakanishi Satoshi Ohkubo, Yasuyuki Tamura, Rinji Sugino, Naoki Awaji, and Kanetake Takasaki).

Nayar, et al., "An Effective Oxidation Technique for the Formation of Thin $SiO_2$ at <500° C," Insulating Films on Semiconductors 1991 Proceedings from the $7^{th}$ Biennial European Conference Including Satellite Workshops on Silicon on Insulator: Materials and Device Technology and the Physics of Hot Electron Degradation in Si Mosfets Liverpoo, pp. 163-166 (Vishal Nayar and Ian. W. Boyd).

Nakanishi, et al., "Oxidation in Ozone," Fujitsu-Scientific and Technical Journal, Fujitsu Limited, Kawasaki, JP, vol. 32, No. 1, Jun. 1, 1996, pp. 128-131 (Toshiro Nakanishi, Satoshi Ohkubo and Yasuyuki Tamura).

* cited by examiner

LOW TEMPERATURE METHOD FOR FORMING A THIN, UNIFORM OXIDE

CROSS-REFERENCE TO RELATED APPLICATIONS

This application is a continuation-in-part of application Ser. No. 08/904,009, titled Method For Thin Film Deposition On Single-Crystal Semiconductor Substrates, filed Jul. 31, 1997 now U.S. Pat. No. 6,020,247. This application claims the benefit of priority from U.S. provisional application 60/063,010, titled Low Temperature Method for Forming a Thin, Uniform Oxide, filed Oct. 23, 1997.

FIELD OF THE INVENTION

This invention pertains generally to forming thin oxides at low temperatures, and more particularly to forming thin, uniform oxides.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits that can accomplish more functions in less time in a smaller package while consuming less power. Miniaturization is a common approach to help meet these goals.

With increasing miniaturization, one concern is the thickness of the gate dielectric used in conventional CMOS circuits. The current drive in a CMOS transistor is directly proportional to the gate capacitance. Since capacitance scales inversely with gate dielectric thickness, higher current drive requires continual reductions in thickness for conventional dielectrics. Present technology uses silicon dioxide ($SiO_2$) based films with thicknesses near 5 nm. However, projections suggest the need for 2 nm (20 Å) films for future small geometry devices.

SUMMARY OF THE INVENTION $SiO_2$ gate dielectrics in this thickness regime pose considerable challenges from a manufacturing perspective. Process control of the growth of a 2 nm film requires unprecedented thickness control. At these thicknesses direct tunneling through the $SiO_2$ may occur, although the effect of tunneling current on device performance may not preclude operation. Since the tunnel current depends exponentially on the dielectric thickness, small variations in process control may result in large variations in the tunnel current, possibly leading to reliability problems.

Another area of concern is the interface between the gate oxide and the channel region of the substrate. This silicon dioxide/silicon interface should be very flat and uniform to help limit interface scattering of electrons in the channel region.

Rapid thermal oxidation and furnace annealing are two current methods for forming gate oxides. However, current methods do not reliably produce gate oxides with the thickness uniformity and interface smoothness that will be needed to make devices with approximately 1.5 nm, 2 nm, or 2.5 nm gate oxides practical.

We disclose a low temperature method for forming a thin gate oxide on a silicon surface. This method comprises providing a partially completed integrated circuit on a semiconductor substrate with a clean silicon surface; and stabilizing the substrate at a first temperature. The method further includes exposing the silicon surface to an atmosphere containing ozone, while maintaining the substrate at the first temperature. In this method, the exposing step creates a first, uniformly thick, gate oxide film.

Preferably, exposing the silicon surface to an atmosphere containing ozone includes exposing the silicon surface to an atmosphere containing molecular oxygen, while irradiating at least a portion of the atmosphere with ultraviolet light, where the light transforms some of the oxygen to ozone. In some embodiments, the atmosphere further includes an inert gas, such as argon. Preferably, the ozone at the silicon surface is not in an excited energy state, such as a plasma. However, a plasma kept away from the wafer may be more acceptable.

In some embodiments, the clean silicon surface is atomically flat. Typically, the semiconductor substrate contains some areas that already have some structure, such as a field oxide. In some embodiments, the substrate has a plurality of clean, atomically flat, silicon surfaces. This might occur when the gate oxide is applied to surfaces exposed by etching "windows" in a layer overlying a silicon surface; or when overlying layers are added to the silicon surface, except where "islands" have been masked off.

In some embodiments, the first temperature is about 25 degrees C. and the oxide film has a thickness of about 10 angstroms. In other embodiments, the first temperature may be up to about 200 degrees C., or even up to 600 degrees C. These temperatures will grow thicker oxides (up to about 35 angstroms) as shown in FIG. 3.

In another aspect of this method, the method further includes depositing a uniformly thick layer of silicon on the first oxide film to form a temporary silicon layer, the temporary silicon layer having a thickness no greater than the potential thickness of oxidizable silicon. This potential thickness is found by determining a planned substrate temperature for a second oxide film formation, the planned temperature no greater than about 200 degrees C. This planned temperature substantially determines the potential thickness of oxidizable silicon. After depositing the silicon, the method further includes exposing the temporary silicon layer to a second atmosphere containing ozone, while the substrate is at the planned substrate temperature. This exposing step oxidizes the temporary silicon layer to form a second, uniformly thick, oxide film extending to the first oxide film; thereby creating a single (combined), uniformly thick, oxide film.

In some embodiments, the method further includes stabilizing the substrate at the planned substrate temperature before the exposing step.

DETAILED DESCRIPTION

Figure 1A:
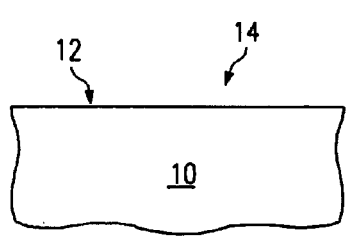
FIG. 1 shows a low temperature method for forming a very thin, uniform oxide layer.
Figure 1B:
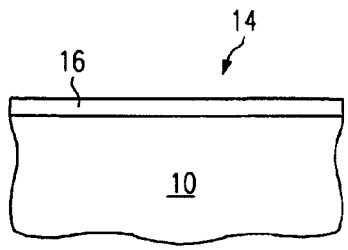
Figure 1C:
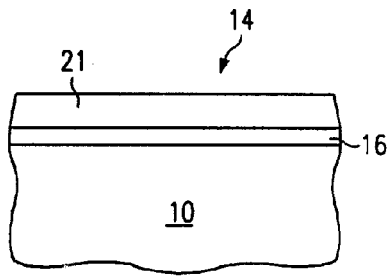
Figure 2A:
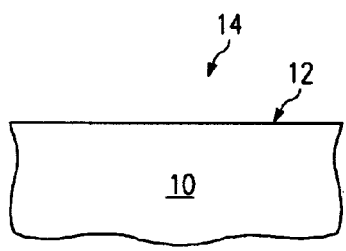
FIG. 2 shows a low temperature method for forming a very thin, uniform oxide layer.
Figure 2B:
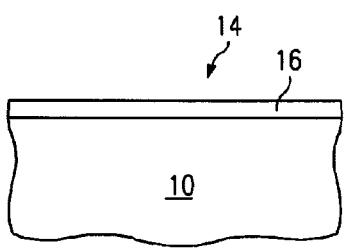
Figure 2C:
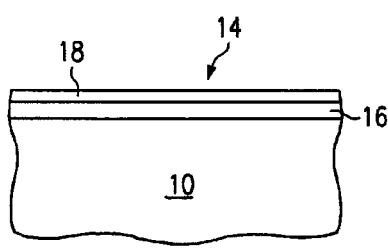
Figure 2D:
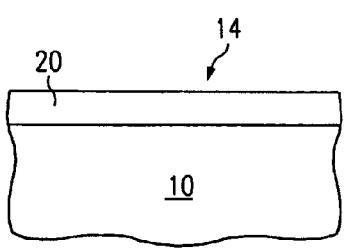

FIG. 1 outlines a method of using this invention to form a very thin, uniform $SiO_2$ gate dielectric on a silicon substrate. Initially, Si substrate 10 with a clean surface 12 is provided. Typically, this substrate 10 will include a partially completed integrated circuit with part of the surface 12 being either bare or hydrogen passivated silicon. This surface 12 may already have structures, such as field oxide regions, already formed upon it, and other structures, such as diffusion regions formed in the substrate beneath it.

We have found that a smooth, flat silicon surface tends to grow a more uniform oxide (particularly for very thin oxides) with this method. Thus, although a hydrogen terminated silicon surface usually produces acceptable results, many very thin, highly uniform silicon dioxide gate dielectrics prefer a silicon underlayer that approaches an atomically flat or atomically stepped surface. For our purposes, an atomically stepped surface will have a very low rms surface roughness, comparable to an atomically flat surface, in most areas. A wafer with an atomically stepped surface may have a series of adjacent flat surfaces (terraces). These terraces typically do not extend across a substrate wafer, and are not required to extend across a single device on a wafer. With very thin gate dielectrics, we sometimes prefer that adjacent terraces be connected by well-defined single- or double-atomic-height steps.

Figure 3:
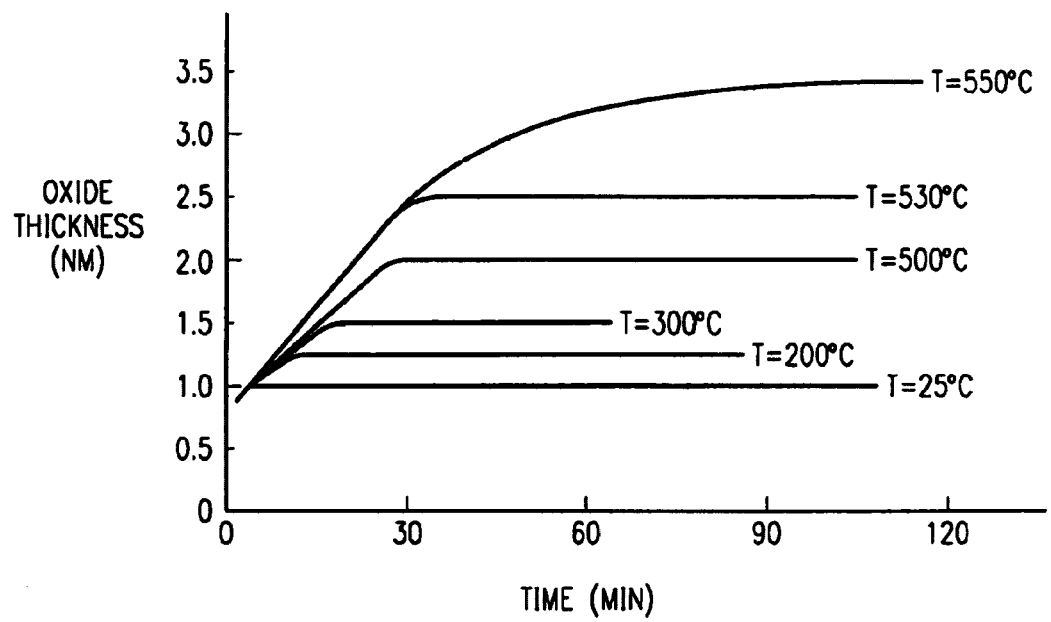
FIG. 3 shows a relationship between time, oxide thickness, and temperature.

After the surface 12 is clean, but before exposure to an oxygen source, the substrate 10 temperature is stabilized at the oxidation temperature. This oxidation temperature substantially depends upon the thickness of the ozone-base oxide desired as shown in FIG. 3. This figure shows that for 1.0 nm oxides, the temperature should be near 25 degrees C. For a 2.0 nm oxide, the temperature should be approximately 500 degrees C. Similarly, 530 degrees C. forms an approximately 2.5 nm oxide, while 550 degrees C. forms an approximately 3.5 nm, high quality oxide. FIG. 3 was generated for UV-generated ozone in substantially pure oxygen at a 400 Torr $O_2$ pressure. Other ozone generation methods, or different oxygen pressures and/or concentrations may require adjustment of the temperature to yield a desired, precise oxide thicknesses.

This ability to grow precise, repeatable, usefully thick oxides at low temperatures greatly simplifies the temperature control problems. The ability to stabilize the whole wafer at the oxidation temperature allows for excellent process control, thus giving a uniform, repeatable oxidation thickness. Useful thermal oxides can be grown on wafers sitting in easily controlled furnaces. We have also found that this method is capable of producing oxides with good electrical properties. This ozone-based method can routinely achieve breakdown voltages above 10 MV/cm, such as 12 to 13 MV/cm.

The clean, temperature stabilized wafer with surface 12 is exposed to ozone 14. We have found that introducing molecular oxygen to the reaction chamber and exposing the oxygen to a mercury lamp (particular with 183 nm and 253 nm emission lines), generates sufficient quantities of ozone. Other ultraviolet sources or other non-energetic ozone sources can be substituted for the mercury lamp generated ozone. One example of a suitable commercial ozone generator is a barrier discharge ozonizer. Energetic ozone sources including commercial ozone generators can be used, but it is preferable to keep the any excited ozone species from contacting the wafer. We have found that methods that allow an ozone plasma to contact the wafer form oxides with poor electrical properties, such as a significantly lower breakdown voltage. The ozone plasma methods also tend to exhibit poor uniformity and have repeatability problems. In our non-plasma ozone-based method, the oxygen/ozone 14 pressure can be varied from below a microtorr to several atmospheres. We have found that pressures between several hundred torr and one atmosphere provide a simple method to provide good results. If desired, the oxygen/ozone 14 can be mixed with an inert gas, such as argon.

This ozone-based process forms a very uniform, substantially thick silicon dioxide layer 16 on the exposed silicon surface 12. This oxide layer 16 is much thicker than a conventional thermal oxide formed from exposing silicon to $O_2$ at the same temperature and time. Of even more importance, this oxide 16 is very repeatable and very uniform, primarily due to its self-limiting nature. When applied to a substantially flat silicon surface, this method repeatably produces $SiO_2$ layers with thickness uniformities better than 3% (better than 0.1 nm uniformity of an 3.0 nm thick oxide) across a 4 inch test wafer. Better heating uniformity can allow thickness uniformities below 1%. In fact, this method's oxide thickness uniformity will likely be limited in practice only by the heating uniformity, as opposed to the oxidation method itself. A typical transistor or capacitor layout will include a gate (or capacitor) electrode 21 superadjacent to the oxide 16.

FIG. 3 shows that this method has a very slight time dependent component. However, for most temperature/thickness combinations, the oxidation rate has already slowed dramatically after 30 to 60 minutes. Thus, this process is nearly self terminating with reasonable reaction times. As such, this method can be relatively insensitive to large variations in oxidation time.

As the chart shows, higher temperatures will produce thicker oxides with this method. We have found that, if the thermal budget allows, we can easily produce high quality, 3.5 nm thermal oxides at only 550° C. Sometimes an artisan may prefer to use lower temperatures, but grow substantially thicker layers than shown in FIG. 3. For this case, we add extra steps as shown in FIG. 2, but still obtain a highly uniform oxide.

This variation involves first forming a highly uniform silicon dioxide layer 16 on a silicon surface 12 as described above. Next, a uniform silicon layer 18 is deposited on the silicon dioxide layer 16. The thickness and uniformity of the final oxide layer will depend upon the thickness of the silicon layer 18. Thus, silicon layer 18 should be formed with a well-controlled method, such as chemical vapor deposition or molecular beam epitaxy. This new silicon surface is then exposed to another ozone/oxygen atmosphere 14, forming a single $SiO_2$ layer 20. In this step, the total thickness of oxide layer 20 is determined by the thickness of the silicon 18 and the underlying $SiO_2$ layer 16. However, the ozone allows complete oxidation of much thicker silicon layers than a straight oxygen atmosphere. If necessary, this silicon deposition and oxidation can be repeated to form thicker layers.

Figure 4:
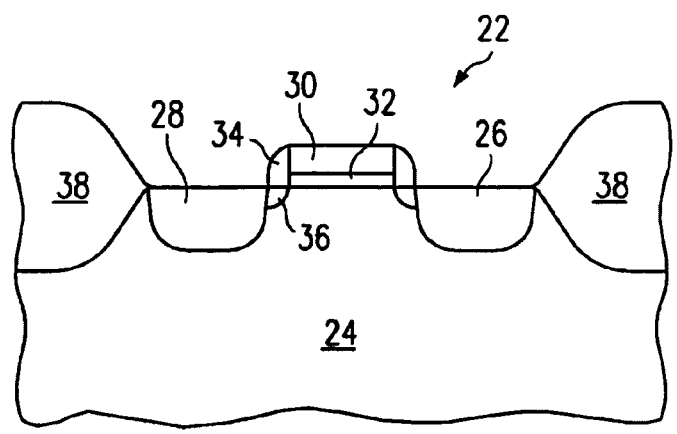
FIG. 4 shows a field-effect transistor using a thin, uniform oxide layer as the gate dielectric.

FIG. 4 shows a metal-oxide-silicon field-effect transistor (MOSFET) embodiment of this invention. Field-effect transistor 22 has four principal parts: a substrate 24, a source 26, a drain 28, and a gate, where the gate includes the gate electrode 30 and thin silicon dioxide gate dielectric 32. For an NMOS transistor 22, p-type silicon substrate 24 includes n+ source 26 and n+drain 28 regions. Gate dielectric 32 is a very thin, very uniform, silicon dioxide film, formed by using ozone to oxidize the cleaned silicon substrate 24. MOSFET transistor 22 also includes sidewall spacers 34, lightly doped drain (LDD) region 36, and isolation region 38. Those skilled in the art will recognize that these and other features may be used or left out, depending upon the particular function of the device and the intended processing flow.

These examples have shown NMOS transistors. Since the ozone-based thin gate oxide method is substantially insensitive to the doping profile of Si, no special modifications are required to implement this invention in PMOS devices or CMOS devices; or into $SiO_2$ based capacitors, which require a thin, very uniform dielectric with low electrical leakage and a high breakdown voltage.

Although this method provides substantial benefits when used to form thin oxide layers, it can also offer an improvement over typical methods for forming thicker high-quality oxide layers, such as a dielectric around the floating gate in a flash memory cell. If the thermal budget permits, this ozone-based method can be used to form relatively thick $SiO_2$ layers in a single pass, or even thicker layers in a layered approach like that described above. Although these thicker layers may require temperature of 600 or 700 degrees C., this variation of the ozone-based method allows lower temperature processing than conventional oxidation processes. Not only do these lower temperatures help the thermal budget, but the self-limiting nature of a ozone-based process improves process repeatability and oxide thickness uniformity, without sacrificing the oxide's electrical quality.

The present invention has been described with several sample embodiments. However, various changes and modifications may be suggested to one skilled in the art. It is intended that the present invention encompass such changes and modifications as fall within the scope of the appended claims.

We claim:

1. A low temperature method for forming a thin gate oxide on a silicon surface, the method comprising:
    providing a partially completed integrated circuit on a semiconductor substrate with a clean, atomically flat, silicon surface;
    stabilizing the substrate at a first temperature no greater than about 200 degrees C.;
    exposing the silicon surface to an atmosphere including ozone, while maintaining the substrate at the first temperature, wherein the exposing step creates a first, uniformly thick, gate oxide film.

2. The method of claim 1, wherein exposing the silicon surface to an atmosphere including ozone comprises:
    exposing the silicon surface to an atmosphere including molecular oxygen, while irradiating at least a portion of the atmosphere with an ultraviolet light, the light operative to transform some of the oxygen to ozone.

3. The method of claim 1, wherein the atmosphere further comprises molecular oxygen.

4. The method of claim 1, wherein the atmosphere further comprises an inert gas.

5. The method of claim 1, wherein exposing the silicon surface to an atmosphere including ozone includes exposing the silicon surface to an atmosphere with less energy than a plasma.

6. The method of claim 5, wherein at least part of the atmosphere that does not contact the silicon surface includes an ozone plasma.

7. The method of claim 1, wherein the atomically flat, silicon surface is an atomically stepped surface.

8. The method of claim 1, wherein the semiconductor substrate includes a plurality of clean, atomically flat, silicon surfaces.

9. The method of claim 1, further comprising forming a gate electrode on the gate oxide film.

10. The method of claim 1, wherein the first temperature is about 25 degrees C. and the oxide film has a thickness of about 10 angstroms.

11. The method of claim 1, wherein the first temperature is between 0 and 200 degrees C. and the oxide film has a thickness between 5 and 20 angstroms.

12. The method of claim 1, wherein the first temperature is about 200 degrees C.

13. The method of claim 1, wherein the first temperature is about 200 degrees C. and the oxide film has a thickness of about 12 angstroms.

14. The method of claim 1, further comprising:
    determining a planned substrate temperature for a second oxide film formation, the planned temperature no greater than about 200 degrees C.; thereby substantially determining a potential thickness of oxidizable silicon;
    depositing a uniformly thick layer of silicon on the first oxide film to form a temporary silicon layer, the temporary silicon layer having a thickness no greater than the potential thickness of oxidizable silicon;
    exposing the temporary silicon layer to a second atmosphere including ozone, while the substrate is at the planned substrate temperature,
    wherein the exposing step oxidizes the temporary silicon layer to form a second, uniformly thick, oxide film extending to the first oxide film; thereby creating a combined, uniformly thick, oxide film.

15. The method of claim 14, further comprising:
    stabilizing the substrate at the planned substrate temperature before the exposing step.

16. The method of claim 14, further comprising:
    repeating the determining, depositing, and exposing at the planned temperature steps at least once; thereby increasing the thickness of the combined oxide film.

17. The method of claim 14, wherein the first temperature and the planned temperatures are about 25 degrees C. and the combined oxide film has a thickness of about 20 angstroms.

18. The method of claim 1, wherein the gate oxide film has a voltage breakdown resistance greater than about 10 MV/cm.

19. A low temperature method for forming a thin gate oxide on a silicon surface, the method comprising:
    providing a partially completed integrated circuit on a semiconductor substrate with a clean silicon surface;
    stabilizing the substrate at a first temperature no greater than about 200 degrees C.;
    exposing the silicon surface to an atmosphere including ozone, while maintaining the substrate at the first temperature, wherein the exposing step creates a first, uniformly thick, gate oxide film; and
    forming a gate electrode on the oxide film.

20. The method of claim 19, wherein the clean silicon surface is a hydrogen terminated silicon surface.

21. The method of claim 19, further comprising:
    determining a planned substrate temperature for a second oxide film formation, the planned temperature no greater than about 200 degrees C.; thereby substantially determining a potential thickness of oxidizable silicon;
    depositing a uniformly thick layer of silicon on the first oxide film to form a temporary silicon layer, the temporary silicon layer having a thickness no greater than the potential thickness of oxidizable silicon;

exposing the temporary silicon layer to a second atmosphere including ozone, while the substrate is at the planned substrate temperature, wherein the exposing step oxidizes the temporary silicon layer to form a second, uniformly thick, oxide film extending to the first oxide film; thereby creating a combined, uniformly thick, oxide film.

22. The method of claim 21, further comprising:

stabilizing the substrate at the planned substrate temperature before the exposing step.

23. The method of claim 21, further comprising:

repeating the determining, depositing, and exposing at the planned temperature steps at least once; thereby increasing the thickness of the combined oxide film.

24. The method of claim 19, wherein the gate oxide film has a voltage breakdown resistance greater than about 10 MV/cm.

25. The method of claim 19, wherein the gate oxide film has a voltage breakdown resistance of at least 12 MV/cm.

* * * * *